(12) United States Patent
Radionov et al.

(10) Patent No.: US 7,460,623 B1
(45) Date of Patent: Dec. 2, 2008

(54) DIGITAL TWO-STAGE AUTOMATIC GAIN CONTROL

(75) Inventors: Vladimir Radionov, San Ramon, CA (US); Ryan Yu, Sunnyvale, CA (US)

(73) Assignee: Broadlogic Network Technologies Inc., San Jose, CA (US)

( * ) Notice: Subject to any disclaimer, the term of this patent is extended or adjusted under 35 U.S.C. 154(b) by 493 days.

(21) Appl. No.: 10/360,834

(22) Filed: Feb. 6, 2003

(51) Int. Cl.
*H04L 27/08* (2006.01)

(52) U.S. Cl. .................. 375/345; 375/130; 375/142; 375/239; 375/316; 375/340

(58) Field of Classification Search .......... 375/345, 375/130, 142, 239, 316, 340; 455/234.1, 455/239.1, 245.1, 250.1
See application file for complete search history.

(56) References Cited

U.S. PATENT DOCUMENTS 6,553,084 B1 * 4/2003 Maru ................. 375/345
6,843,597 B1 * 1/2005 Li et al. ............. 375/345
6,868,263 B2 * 3/2005 Filipovic ........... 455/245.1
7,031,409 B2 * 4/2006 Brobston et al. .... 375/345

* cited by examiner

*Primary Examiner*—Jean B. Corrielus
*Assistant Examiner*—Nader Bolourchi
(74) *Attorney, Agent, or Firm*—Townsend and Townsend and Crew LLP

(57) ABSTRACT

A digital automatic gain control circuit is disclosed. The circuit includes a selector, a scaler, a detector, a gain adjustor and a controller. In one exemplary aspect, the selector receives an input signal having two components, namely, the in-phase (I) and quadrature (Q) components, in digital form. The selector then selects a subset of bits from each component based on a control signal provided by the controller. The two subsets are then forwarded to the scaler. The scaler then multiplies the two subsets respectively against a gain value to generate two multiplication results. A portion of each multiplication result is then provided as output by the scaler. The gain value and the subset selection are periodically adjusted in response to the scaler output. The adjustments with respect to the gain value and the subset selection are effectuated collectively by the detector, the gain adjustor and the controller.

41 Claims, 6 Drawing Sheets

DIGITAL TWO-STAGE AUTOMATIC GAIN CONTROL

BACKGROUND OF THE INVENTION

The present invention generally relates to an automatic gain control circuit and, more specifically, to an automatic gain control circuit in which the automatic gain control function is performed entirely in the digital domain.

Generally, automatic gain control is a process by which an input is scaled to an appropriate level so that an output that is dependent on the input can be maintained at a corresponding relatively constant level. There are various existing schemes or techniques that can be used to provide automatic gain control. These schemes generally fall into one of three categories including, analog, all-digital, and hybrid (e.g., digital control with a numerically controlled amplifier).

In some communication systems, the total power of a multi-channel signal is stabilized before the signal is provided to a digital channelizer. The digital channelizer then processes the signal to generate a number of individual channelizer outputs. Depending on the number of active channels within the signal and the relative power of each individual channel, mutual difference in the power between individual channelizer outputs can be quite high, for example, 30 dB. As a result, the function of automatic gain control is typically implemented at each channelizer output individually and all-digital automatic gain control techniques are usually used to achieve this function.

All-digital automatic gain control techniques further fall into one of two main categories including, direct automatic gain control and feedback-based automatic gain control. Direct automatic gain control is based on actual measurements of either the power or the average magnitude of the signal. Making these measurements is often computationally expensive. Feedback-based automatic gain control provides direct adjustment of the gain based on the output. FIG. 1 is a simplified schematic block diagram illustrating a typical circuit providing feedback-based automatic gain control. Typically, feedback-based automatic gain control is more suitable for applications where minimum hardware complexity is desired. Existing all-digital automatic gain control techniques have their shortcomings and disadvantages. For example, currently, even the simplest implementation of a feedback-based automatic gain control requires multipliers on a signal path. If the dynamic range of input data is dozens of decibels, the gain value must be represented by a long wordlength, which essentially means increasing implementation complexity of a multiplier. Hence, it would be desirable to provide a method and system that is capable of achieving improved automatic gain control in a digital domain with reduced implementation complexity.

BRIEF SUMMARY OF THE INVENTION

A digital automatic gain control circuit is disclosed. In one exemplary embodiment, the circuit includes a selector, a scaler, a detector, a gain adjustor and a controller. The total gain of the automatic gain control circuit is distributed between the selector and the scaler. In one exemplary aspect, the selector receives an input signal having two components, namely, the in-phase (I) and quadrature (Q) components, in digital form. The selector then selects a subset of bits from each component based on a control signal provided by the controller. The selection of the subset of bits provides a coarse gain control with a single bit step. The two subsets are then forwarded to the scaler. The scaler then multiplies the two subsets respectively against a gain value to generate two multiplication results. This provides a fine gain control of the gain value with substantially limited dynamic range. A portion of each multiplication result is then provided as output by the scaler. The gain value and the bit subset selection are periodically adjusted in response to the scaler output. The adjustments with respect to the gain value and the subset selection are effectuated collectively by the detector, the gain adjustor and the controller.

In an exemplary implementation, the present invention is utilized to provide digital automatic gain control for single- or multi-channel quadrature amplitude modulation (QAM) demodulators.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings, like reference numbers indicate identical or functionally similar elements.

DETAILED DESCRIPTION OF THE INVENTION

Figure 1:
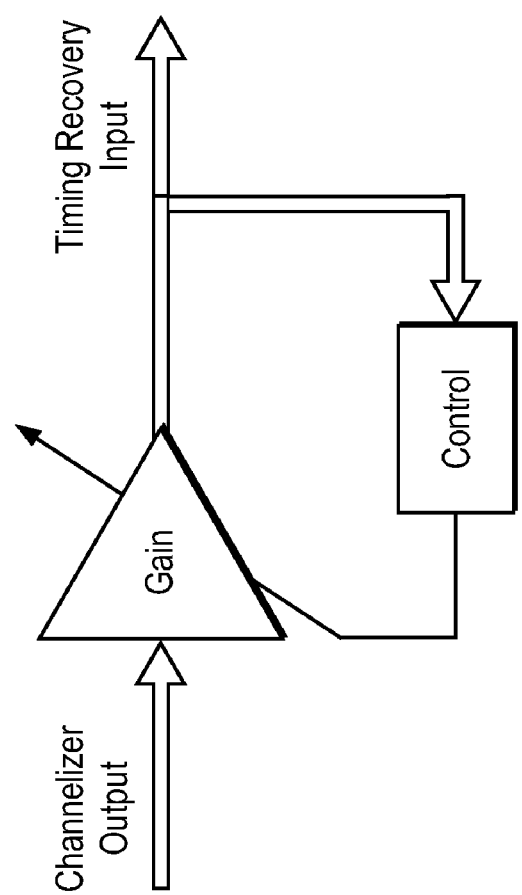
FIG. 1 is a simplified schematic block diagram illustrating a typical circuit providing feedback-based automatic gain control.
Figure 2:
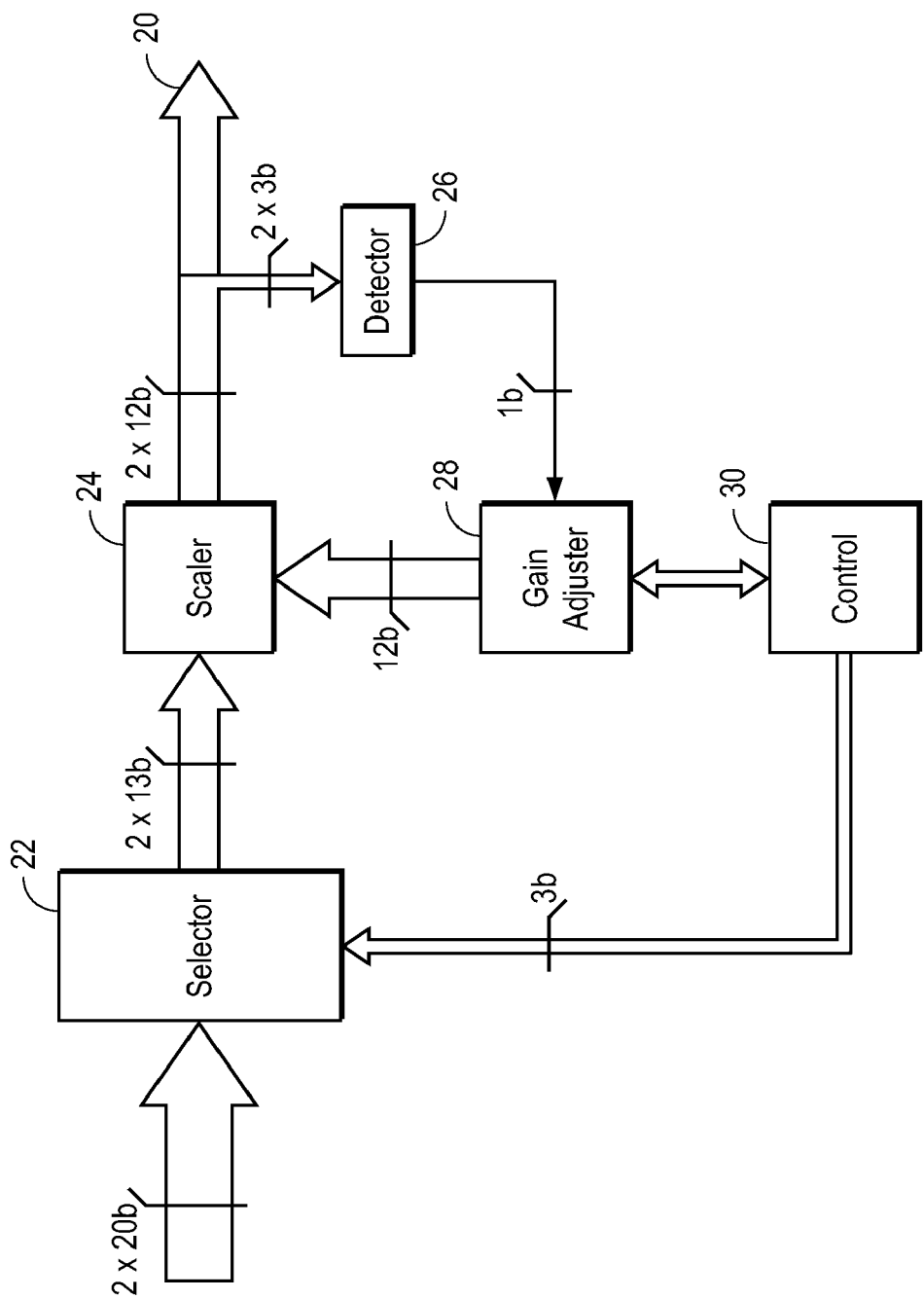
FIG. 2 is a simplified schematic block diagram illustrating an exemplary embodiment of the present invention.

The present invention in the form of one or more exemplary embodiments will now be described. FIG. 2 is a simplified schematic block diagram illustrating an exemplary embodiment of the present invention. This exemplary embodiment represents an automatic gain control (AGC) circuit 20. The AGC circuit 20 includes a selector 22, a scaler 24, a detector 26, a gain adjustor 28 and a controller 30.

The selector 22 receives two (2) input components. In an exemplary embodiment, the two (2) input components are two (2) asynchronously sampled 20-bit digital I and Q components, respectively. It is commonly understood in signal processing art that a signal can be broken down and represented as two components, namely, the I and Q components. Hence, in other words, the selector 22 receives an input signal that is represented by the two (2) input components. In an exemplary embodiment, the automatic gain control circuit 20 can be used to process a baseband signal or a passband signal.

A predetermined number of bits from each input component is selected and passed as input to the scaler 24. In this embodiment, the predetermined number of bits is thirteen (13). In addition, how the predetermined number of bits from each input component is selected is based on an address generated by the controller 30. The address generated by the controller 30 is a 3-bit address. The 3-bit address is maintained by the controller 30 in a 3-bit selector address counter. Effectively, the selector 22 performs a coarse automatic gain control function by scaling the input components up. More specifically, by selecting thirteen (13) bits from each 20-bit input component, the selector 22 is scaling each 20-bit input component up with a ~6 dB step. More generally, the bit subset selection represents a coarse gain adjustment performed by the selector 22. The gain of the selector 22 is $G_{sel}=2^n$, n=0 . . . 7.

Upon receiving the two (2) 13-bit I and Q components, the scaler 24 multiplies the two (2) 13-bit I and Q components by a 12-bit gain value $G_{sc}$ thereby generating two multiplication results. The 12-bit gain value $G_{sc}$ is provided to the scaler 24 by the gain adjustor 28. In an exemplary embodiment, the absolute value of the gain value $G_{sc}$ is within a predetermined interval, for example, between the values of "0.5" and "1.5". After the multiplication, the twelve (12) most significant bits of each multiplication result are selected and then stored in a buffer (not shown) for subsequent use by a timing recovery circuit (not shown). In other words, the scaler 24 generates two (2) output components, each having twelve (12) bits. The two (2) output components represent the processed results of the input signal.

The two (2) output components generated by the scaler 24 are also provided to the detector 26. The detector 26 analyzes the two (2) output components and determines whether the respective magnitudes of the output components are both below a predetermined threshold or, conversely, whether at least the magnitude of one of the output components exceeds the predetermined threshold. The predetermined threshold will be further described below. The determination is represented in binary form as a single bit and passed by the detector 26 to the gain adjustor 28.

The gain adjustor 28 provides the gain value that is used by the scaler 24 to generate its two (2) output components. In one exemplary implementation, the gain adjustor 28 includes a binary counter that is used to store and provide the gain value $G_{sc}$. The gain value $G_{sc}$ is adjusted by the gain adjustor 28 based on the determination received from the detector 26. More specifically, if the determination from the detector 26 indicates that the magnitudes of the two (2) output components from the scaler 24 are below the predetermined threshold, the binary counter is incremented thereby increasing the gain value $G_{sc}$; alternatively, if the determination indicates that the magnitude of at least one of the output components exceeds the predetermined threshold, the binary counter is decremented thereby decreasing the gain value $G_{sc}$. The adjusted gain value $G_{sc}$ is then forwarded by the gain adjustor 28 to the scaler 24 to allow the scaler 24 to update its two (2) output components. The adjusted gain value $G_{sc}$ is also forwarded to the controller 30 for additional evaluation in order to control the selector 22.

The controller 30 performs a number of functions including "gain swapping" and "mode switching". Gain swapping occurs when the gain value $G_{sc}$ reaches either limit of the predetermined range. The predetermined range has a lower limit and an upper limit. In order to provide gain swapping, the controller 30 analyses the state of the gain adjustor 28 and, more specifically, the gain value $G_{sc}$ currently being provided by the gain adjustor 28. The gain value $G_{sc}$ is checked against the lower limit and the upper limit. If the gain value $G_{sc}$ is substantially equal to the value "1.5", then the controller 30 generates the appropriate commands that are then provided to the gain adjustor 28 to shift the contents of the binary counter to the right, and the controller 30 also simultaneously increments the 3-bit selector address counter. As a result, both the gain value $G_{sc}$ and the 3-bit address are adjusted. Adjusting the 3-bit address effectively changes the gain $G_{sel}$ of the selector 22. By adjusting the gain value $G_{sc}$ and the gain $G_{sel}$ of the selector 22, a composite gain $G_{agc}=G_{sel}G_{sc}$ of the automatic gain control circuit 20 remains unchanged. Likewise, if the gain value $G_{sc}$ is substantially equal to the value "0.5", then the controller 30 generates the appropriate commands that are then provided to the gain adjustor 28 to shift the contents of the binary counter to the left, and the controller 30 also simultaneously decrements the 3-bit selector address counter. As a result of the foregoing actions, an absolute level of the signal at the output of the automatic gain control circuit 20 or the composite gain $G_{agc}$ is maintained at a relatively constant level, while the gain value $G_{sc}$ remains within the [0.5 . . . 1.5] interval. It should be understood that the [0.5 . . . 1.5] interval is exemplary and provided for illustrative purposes only. Based on the disclosure and teachings provided herein, a person of ordinary skill in the art will know and appreciate how to select the appropriate range values when implementing the present invention. As will be further described below, gain swapping can be performed in two modes.

During mode switching, the controller 30 controls the switch between two modes, namely, an acquisition mode and a tracking mode. The acquisition mode is used to reach an approximate optimal gain value quickly. The approximate optimal gain value is reached when the gain value $G_{sc}$ falls between the lower limit and the upper limit and remains therein for a certain predetermined time period. Based on the disclosure and teachings provided herein, a person of ordinary will know how to select the predetermined time period. Once the approximate optimal gain value is reached, the tracking mode is used to further fine tune the approximate optimal gain value to a more accurate optimal gain value and to maintain that optimal gain value. The automatic gain control circuit 20 can operate in either one of the two modes. When the automatic gain control circuit 20 is initially powered up, the acquisition mode is engaged to obtain the approximate optimal gain value quickly. During the acquisition mode, gain swapping may be performed one or more times to bring the gain value $G_{sc}$ to the approximate optimal gain value within the predetermined range. Once the approximate optimal gain value is reached, the automatic gain control circuit 20 engages the tracking mode in order to further adjust the approximate optimal gain value more accurately and maintain that optimal gain value. Gain swapping can be triggered during the tracking mode. When the gain value $G_{sc}$ drifts away from its optimal level and reaches either the lower limit or the upper limit, gain swapping is performed to bring the gain value $G_{sc}$ back to its optimal level within the predetermined range.

The controller 30 further includes a free running 11-bit counter clocked with a data sampling rate. This 11-bit counter operates in the acquisition mode only and is disabled after the transition to the tracking mode. Each time gain swapping occurs, the 11-bit counter is reset to the value zero ("0"). If gain swapping does not occur in a predetermined time period or a number of samples, e.g., $2^{11}$ samples, the controller 30 disables the 11-bit counter and switches the gain adjustor 28 to the tracking mode.

The difference between the acquisition mode and the tracking mode is in the magnitude of the gain update or adjustment. Large magnitude yields a high speed of adjustment and, conversely, small magnitude yields a low speed of gain adjustment. In an exemplary embodiment, the length of the binary counter in the gain adjustor (eighteen (18) bits) exceeds the length of the output the gain adjustor (twelve (12) bits). In the acquisition mode, the 12th bit of the binary counter is incremented/decremented; while in the tracking mode, the 18th bit of the binary counter is incremented/decremented. Hence, by using different bits for different modes for the increment/decrement operations, the speed of the gain adjustment in the gain adjustor 28 is varied depending on which mode is engaged.

Figure 3:
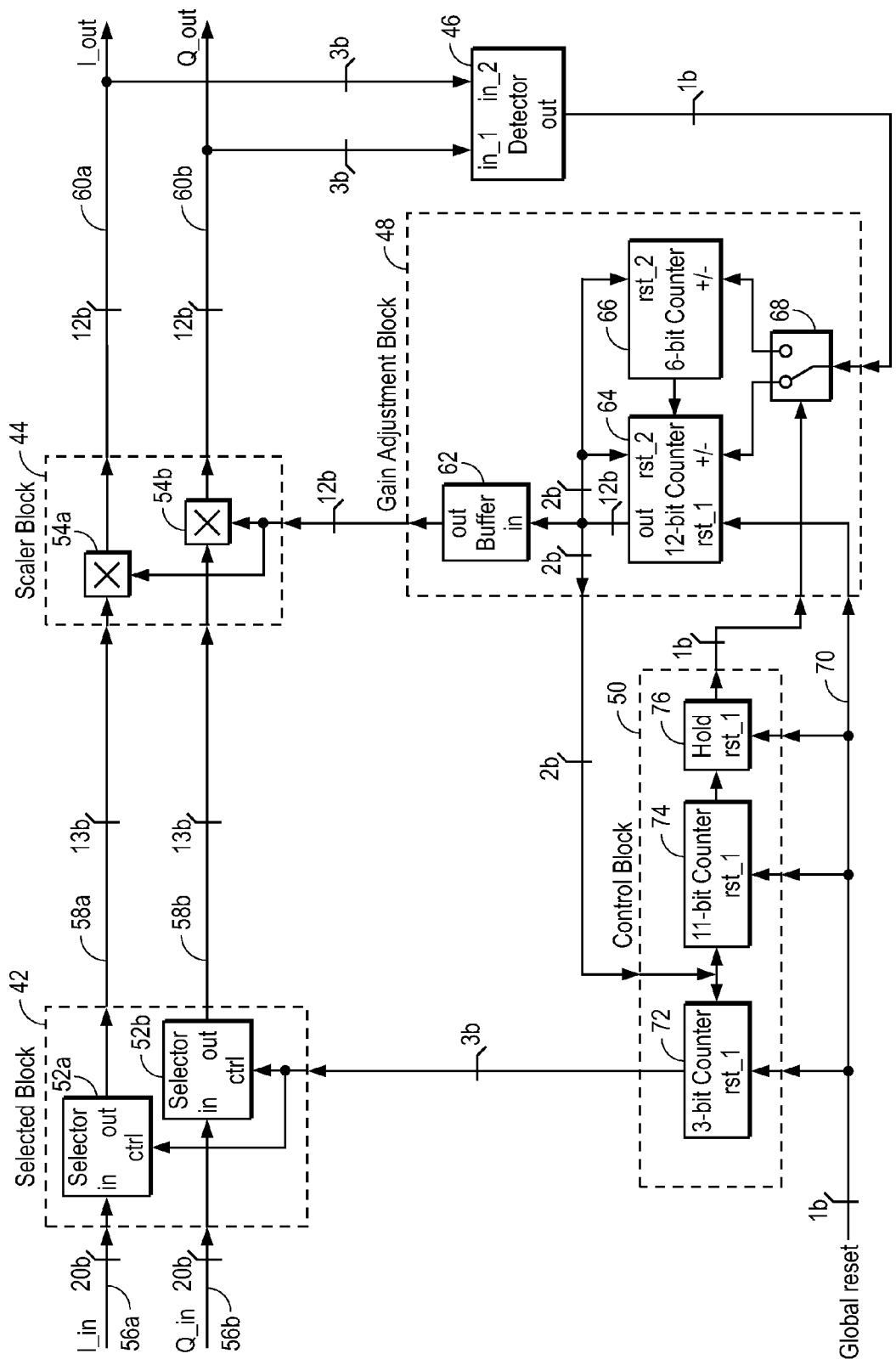
FIG. 3 is a simplified schematic block diagram illustrating one implementation of the exemplary embodiment of the present invention as shown in FIG. 2.

FIG. 3 represents one implementation of the exemplary embodiment of the present invention as shown in FIG. 2. Similar to FIG. 2, the automatic gain control 40 as shown in FIG. 3 includes the selector 42, the scaler 44, the detector 46, the gain adjustor 48, and the controller 50. In this exemplary implementation, the selector 22 includes two (2) sub-selectors 52a and 52b. The sub-selectors 52a and 52b respectively receive two (2) 20-bit input components 56a and 56b, namely, the I and Q components, representing an input signal. Each sub-selector 52a and 52b passes a 13-bit subset 58a and 58b of the 20-bit input component as output. How the 13-bit subset is selected is based on a 3-bit control signal issued by the controller 50. For example, when the 3-bit control signal is '000', the thirteen (13) most significant bits from the 20-bit input component are passed; and when the 3-bit control signal is '111', the thirteen (13) least significant bits are passed as output. Based on the disclosure and teachings provided herein, a person of ordinary skill in the art will know and appreciate other ways and/or methods to select the appropriate size and contents of the subset.

The scaler 44 includes two (2) 2's complement multipliers 54a and 54b. Each multiplier 54a and 54b has a 13-bit input 58a and 58b received from the selector 42. A '0' most significant bit is added to the 12-bit gain value provided by the gain adjustor 48 to provide a 13-bit 2's complement gain value. For each multiplier 54a and 54b, the 13-bit gain value is multiplied against the respective 13-bit inputs 58a and 58b received from the selector 42 to generate two 26-bit 2's complement multiplication results. For each multiplication result, twelve (12) bits (b13 ... b24) out of a total of twenty-six (26) output bits (b0 ... b25) are passed as output of the scaler 44. In other words, the scaler 44 generates two (2) output components 60a and 60b of twelve (12) bits each.

Figure 4:
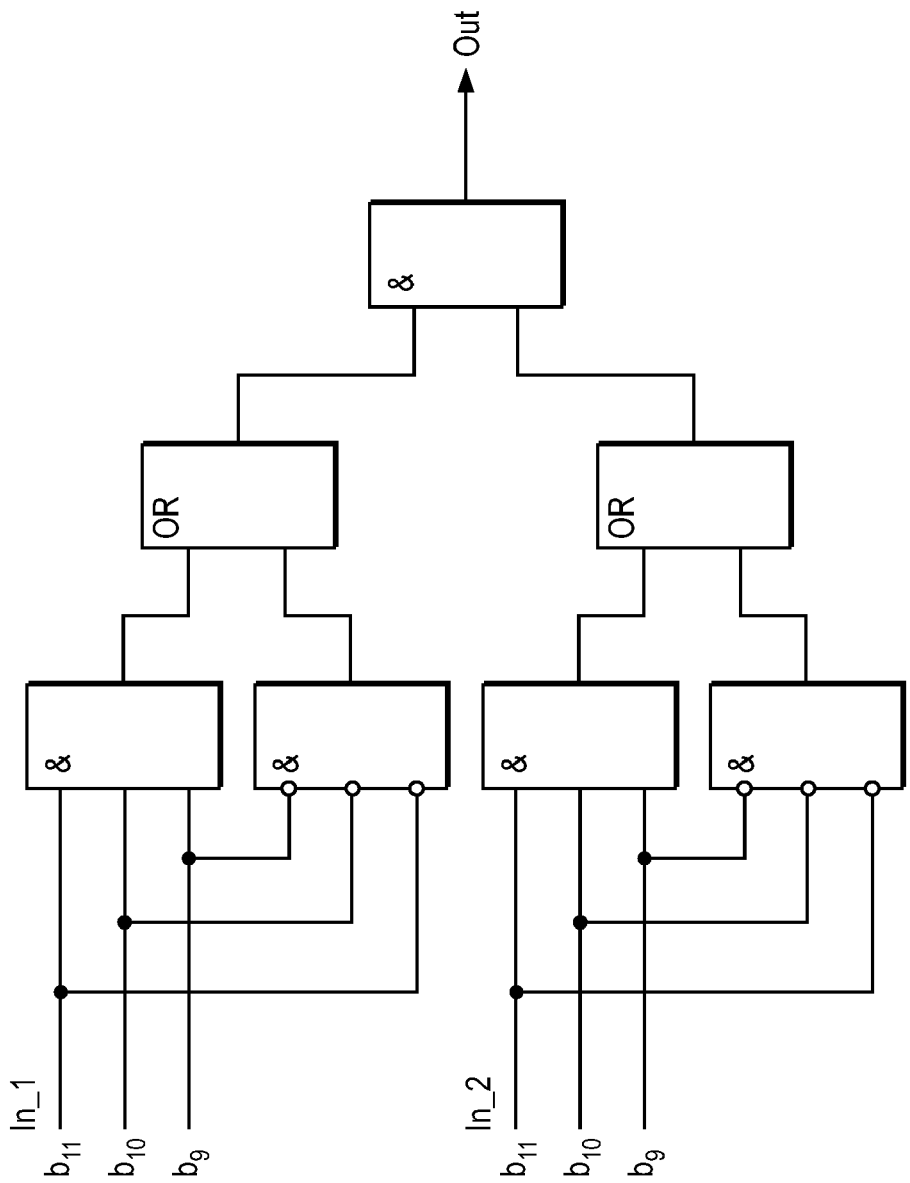
FIG. 4 is a simplified schematic block diagram representing one exemplary embodiment of a detector in accordance with the present invention.

The detector 46 then analyzes the two (2) output components 60a and 60b generated by the scaler 44. If it is determined that the absolute values of both output components 60a and 60b (I and Q components) are below a predetermined threshold, then the output of the detector 46 is set to a logical value of "1"; otherwise, the output of the detector 46 is set to a logical value of '0'. In an exemplary embodiment, the value of the predetermined threshold is chosen as a negative power of two (2), e.g., "0.25". By setting the predetermined threshold as a negative power of two (2), detection is reduced to the joint logical analysis of the respective three (3) most significant bits of each the output components 60a and 60b. An exemplary implementation of the detector 46 is shown in FIG. 4. Based on the disclosure and teachings provided herein, a person of ordinary skill in the art will know and appreciate other ways and/or methods to implement the detector 46 and select the appropriate predetermined threshold in accordance with the present invention.

The gain adjustor 48 includes a buffer 62, a two-cascade counter made up of a high-bit (12-bit) counter 64 and a low-bit (6-bit) counter 66, and a mode switch 68. The buffer 62 holds the gain value from the high-bit counter 64 updated in the previous clock cycle. Both the high-bit counter 64 and low-bit counter 66 are free-running counters clocked with the data sampling rate. At startup, the high-bit counter 64 is reset to a logical value of '10 ... 0' by a global reset signal 70 at the input 'rst_1'. After startup, the acquisition mode is engaged. At this time, the mode switch 68 passes the output signal of the detector 46 to the '+/−' input of the high-bit counter 64. Depending on the value of the detector output (either '1' or '0'), the high-bit counter 64 is incremented or decremented accordingly in the least significant bit, while the low-bit counter 66 remains inactive. Hence, in the acquisition mode, only a high-bit part of the two-cascade counter is active.

In the tracking mode, the mode switch 66 passes the output signal of the detector 46 to the '+/−' input of the low-bit counter 66. Depending on the value of the detector output (either '1' or '0'), the two-cascade counter (made up of the high-bit counter 64 and the low-bit counter 66) is incremented or decremented accordingly in the least significant bit.

In both modes, after the two-cascade counter is updated and before the contents of the buffer 62 is rewritten, the output of the two-cascade counter is subject to analysis. The output of the two-cascade counter represents the gain value $G_{sc}$. More specifically, the output of the two-cascade counter is evaluated to determine whether it falls below a lower limit or exceeds an upper limit. In an exemplary embodiment, the lower and upper limits are chosen as "0.5" and "1.5" respectively. By selecting the foregoing values respectively for the lower and upper limits, the analysis is reduced to the two (2) most significant bits of the high-bit counter 64. If the two (2) most significant bits have the logical values '11', then the contents of the two-cascade counter are shifted to the right; if the two (2) most significant bits have the logical values '00', then the contents of the two-cascade counter are shifted to the left; otherwise, the contents of the two-cascade counter remain unchanged.

The controller 50 includes an externally enabled selector address counter 72, a free-running mode switch counter 74, and a hold block 76. Based on the global reset signal 70, the relevant components including, for example, the selector address counter 72, the mode switch counter 74, the hold block 76, and the high-bit counter 64, are set to the logical value '0'.

The state change of the selector address counter 72 occurs when the gain value $G_{sc}$ reaches either the lower limit or the upper limit, synchronously with the shift of the contents of the two-cascade counter within the gain adjustor 48. In an exemplary embodiment, the selector address counter 72 is incremented if the two (2) most significant bits in the high-bit counter 64 have the logical values '11'; the selector address counter 72 is decremented if the two (2) most significant bits have the logical values '00'; and, otherwise, the selector address counter 72 remains unchanged.

The mode switch counter 74 is free-running, i.e., the counter 74 is operational with every clock cycle and performs the function of a timer. The mode switch counter 74 is reset to the logical value '0' when the gain value $G_{sc}$ reaches either the lower limit or the upper limit. In an exemplary embodiment, the mode switch counter 74 is reset if the two (2) most significant bits in the high-bit counter 64 are equal; otherwise, the mode switch counter 74 is not reset. If the mode switch counter 74 is not reset, the mode switch counter 74 continues to keep count during every clock cycle and eventually comes to saturation, i.e., it reaches the maximum count. When the mode switch counter 74 reaches saturation, the hold block 76 is caused to flip from logical state '0' to logical state '1'. The change in logical state represents a switch from the acquisition mode to the tracking mode. The hold block state remains unchanged until the next global reset signal 70 is received.

The exemplary implementation as shown in FIG. 3 provides minimum hardware complexity. More specifically, the exemplary implementation uses only two (2) multipliers, selection circuitry that is shared between input channels, three (3) or four (4) counters, and simple logic circuitry for each individual channel. As can be seen, no arithmetical computations are involved in the process of gain adjustment.

Based on the disclosure and teachings provided herein, a person of ordinary skill in the art will know and appreciate other ways and/or methods to implement the present invention.

The exemplary embodiment as shown in FIG. 3 above illustrates the processing of a single input signal or channel. However, it should be understood that the present invention is capable of processing multiple input signals from one or more channels. In an alternative exemplary embodiment (not shown), the selector 22, 42 and the scaler 24, 44 are capable of handling multiple signals. In other words, the selector 22, 42 and the scaler 24, 44 can be shared amongst channels in order to process multiple signals. For efficiency purposes, the detector 26, 46, the gain adjustor 28, 48 and the controller 30, 50 are collectively dedicated to the processing of a single signal. The detector 26, 46, the gain adjustor 28, 48 and the controller 30, 50 can be viewed collectively as a gain processing circuit for a corresponding signal. Hence, when multiple signals are processed, corresponding gain processing circuits including sets of detectors, gain adjustors and controllers are utilized. The different configurations of the automatic gain control circuit 20, 40 as described above are merely illustrative. Based on the disclosure and teachings provided herein, a person of ordinary skill in the art will know and appreciate how to employ other circuit configurations to implement the present invention.

Figure 5:
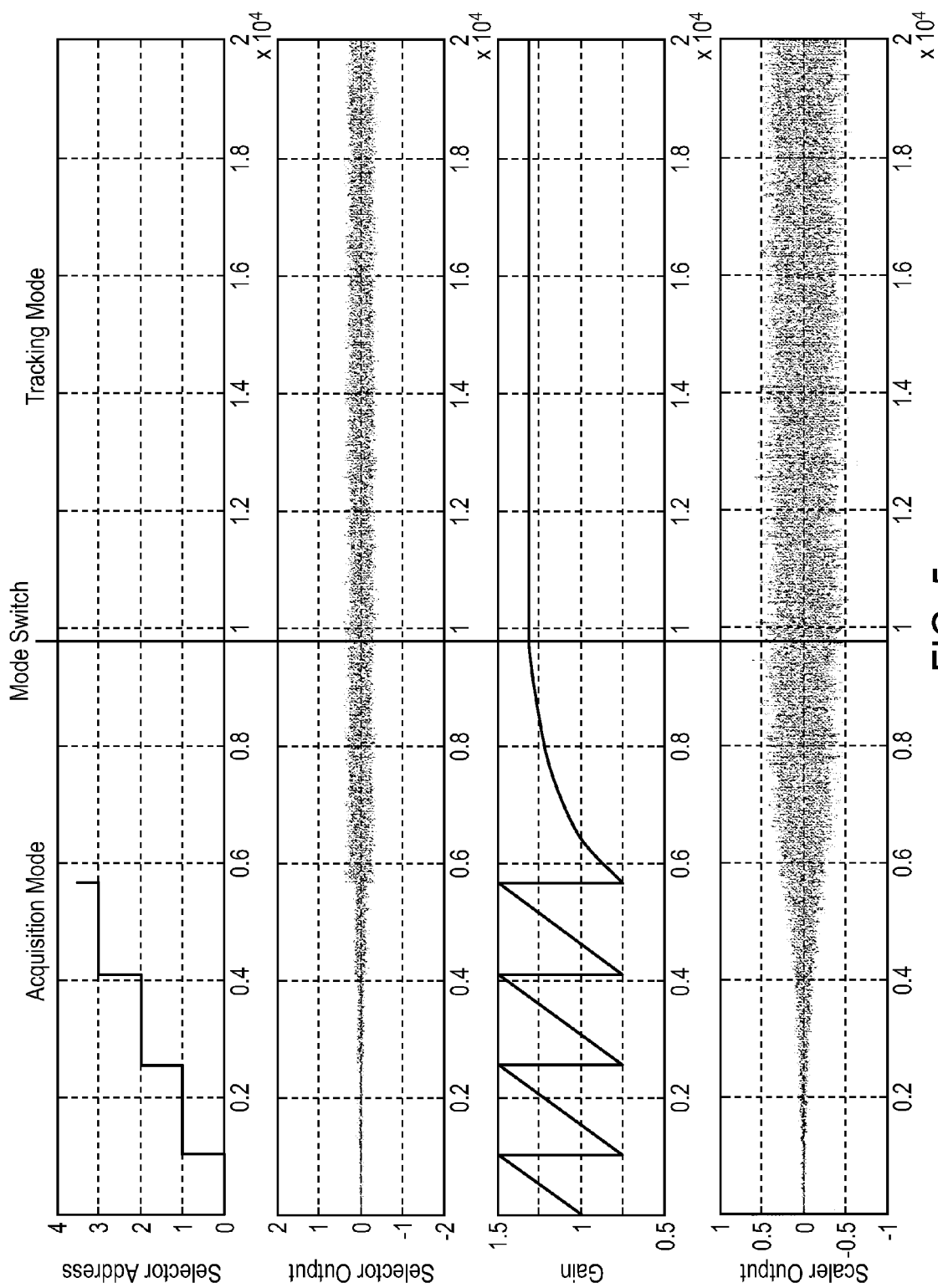
FIGS. 5 and 6 are timing diagrams illustrating the operational results of an exemplary embodiment of the present invention.
Figure 6:
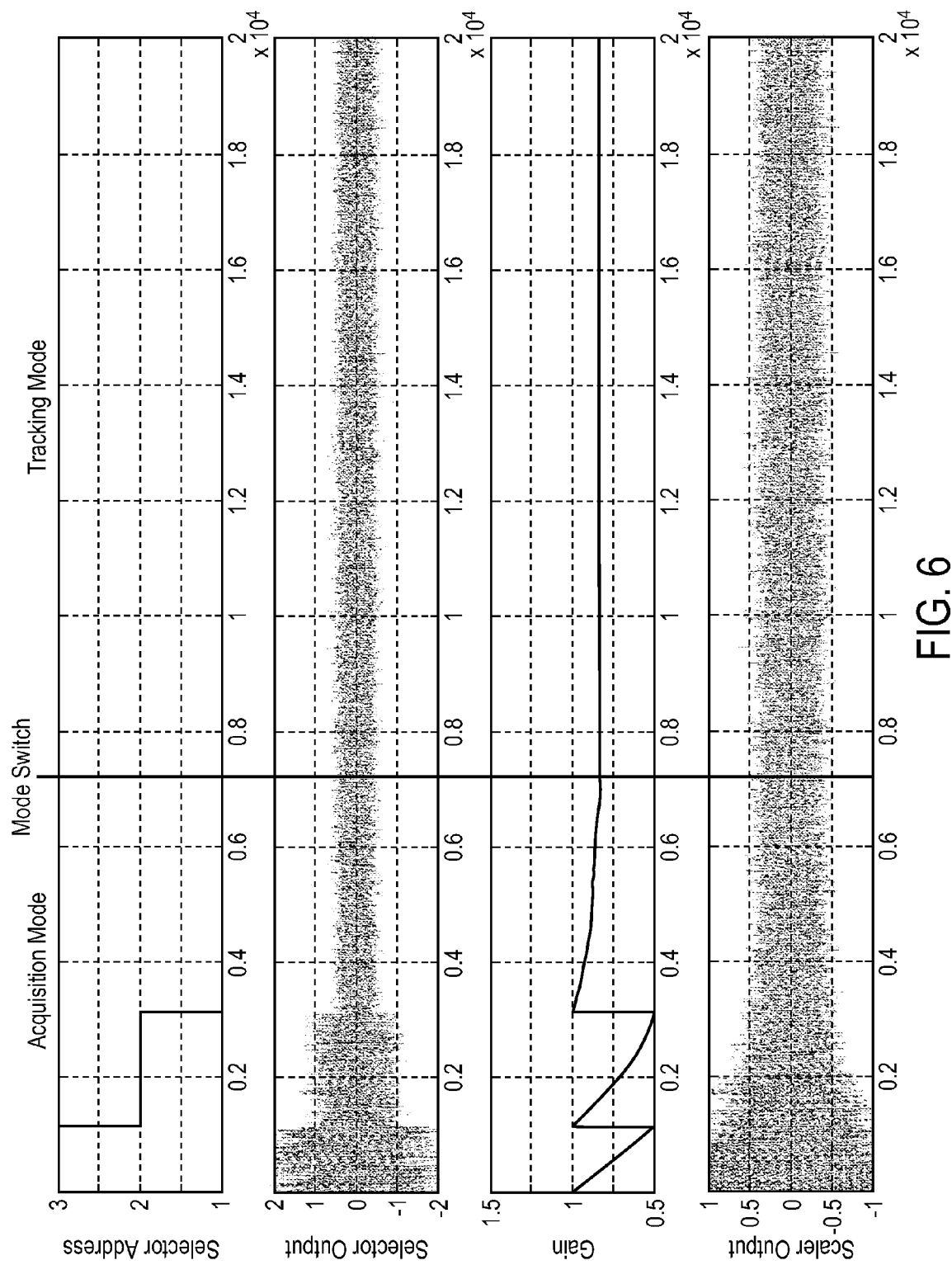

FIGS. 5 and 6 are timing diagrams illustrating the operational results of an exemplary embodiment of the present invention. FIG. 5 represents the timing diagrams associated with the processing of a low-level signal by an exemplary embodiment of the present invention. As shown in FIG. 5, the selector address (i.e., the control signal from the controller 30, 50) changes progressively in the acquisition mode and finally reaches a steady value when the tracking mode is engaged. Due to the changing nature of the selector address, the selector output also changes progressively in the acquisition mode and similarly reaches a steady value when the tracking mode is engaged. During the acquisition mode, the gain value also varies. This is because, as described above, the gain adjustor 28, 48 operates to reach the optimal level for the gain value during the acquisition mode. The jagged or zigzag shape of the gain value indicates that the gain swapping function is performed by the gain adjustor 28, 48. In this particular case, the gain value repeatedly reaches the upper limit and, as a result, the gain adjustor 28, 48 repeatedly brings the gain value down below the upper limit. Once the optimal level for the gain value is reached, the optimal level is maintained in the tracking mode. Finally, since the scaler output is affected by both the gain value and the selector output, the scaler output also changes progressively in the acquisition mode and likewise reaches a steady value when the tracking mode is engaged.

FIG. 6 represents the timing diagrams associated with the processing of a high-level signal by an exemplary embodiment of the present invention. FIG. 6 provides information that is similar to that shown in FIG. 5. In this particular case, however, the gain value repeatedly reaches the lower limit and, as a result, the gain adjustor 28, 48 repeatedly brings the gain value up above the lower limit. Likewise, once the optimal level for the gain value is reached, the optimal level is maintained in the tracking mode.

In an exemplary application, the present invention is utilized to provide digital automatic gain control for single- or multi-channel quadrature amplitude modulation (QAM) demodulators. Based on the disclosure and teachings provided herein, a person of ordinary skill in the art will know of other ways and/or methods to apply the present invention.

It should be understood that the present invention can be implemented in hardware including circuitry, software or a combination of both. Based on the disclosure and teachings provided herein, a person of ordinary skill in the art will know and appreciate the various ways and/or methods that can be used to implement the present invention.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference for all purposes in their entirety.

What is claimed is:

1. A system for providing automatic gain control, comprising:
   a selector configured to receive an input signal having a first component and a second component, the first component and the second component being in digital form, the selector further configured to select respective bit portions from the first and second components based on a control signal to generate a first selected output and a second selected output;
   a scaler configured to receive the first and second selected outputs, to multiply the first and second selected outputs against a gain value, and to generate a first scaled output and a second scaled output respectively;
   a gain adjustor configured to provide the gain value and to adjust the gain value based on a signal derived from the first and second scaled outputs, wherein,
      the gain adjustor includes first and second cascaded up/down counters,
      the gain value is provided at the output of the first counter, and
      in a first state, the signal representing the first and second scaled outputs is communicated to the first counter, and in a second state, the signal representing the first and second scaled outputs is communicated to the second counter; and
   a controller configured to adjust the control signal based on the gain value.

2. The system of claim 1 further comprising:
   a detector configured to evaluate the first and second scaled outputs, or respective portions thereof, and generate an evaluation result;
   wherein the evaluation result is used by the gain adjustor to determine how to adjust the gain value.

3. The system of claim 2 wherein the detector evaluates the first and second scaled outputs to determine whether the respective absolute values of both of the first and second scaled outputs fall below a predetermined threshold.

4. The system of claim 1 wherein:
   the gain value is held in a register having sufficient bits to store values over a maximum range; and
   the gain value is maintained within a predetermined range that is narrower than the maximum range.

5. The system of claim 1 wherein the first component is an in-phase (I)-component and the second component is a quadrature (Q)-component.

6. The system of claim 1 wherein:
   the gain adjustor operates in one of a plurality of modes including an acquisition mode and a tracking mode;
   during the acquisition mode, the gain adjustor seeks an optimal level for the gain value, the optimal level being within a predetermined range having two delimiting limits;

during the tracking mode, the gain adjustor maintains the optimal level for the gain value; and during the tracking mode, upon the gain value reaching either one of the two delimiting limits, the gain adjustor and the controller simultaneously adjust the gain value and the control signal respectively, thereby maintaining a composite gain for the system relatively unchanged while keeping the gain value within the predetermined range.

7. The system of claim 6 wherein:

the gain adjustor continues to engage in the acquisition mode if gain swapping occurs within a predetermined time period; and the gain adjustor switches from the acquisition mode to the tracking mode if gain swapping does not occur within the predetermined time period.

8. The system of claim 1 wherein the system is implemented using hardware, software or a combination of both.

9. A demodulator incorporating the system of claim 1.

10. An automatic gain control circuit, comprising:

a selector circuit configured to receive a plurality of input signals, each input signal having a first component and a second component, the first and second components being in digital form, the selector circuit further configured to select respective bit portions from the first and second components of each input signal based on a corresponding control signal to generate a pair of corresponding first and second selected outputs for each input signal;

a scaler circuit configured to receive the corresponding pairs of first and second selected outputs for the plurality of input signals and multiply each corresponding pair of first and second selected outputs against a corresponding gain value and generate a corresponding pair of first and second scaled outputs; and a plurality of gain processing circuits, each gain processing circuit associated with an input signal and configured to adjust the corresponding gain value and control signal for the associated input signal based on the corresponding pair of first and second scaled outputs wherein at least one of the gain processing further comprises a gain adjustor configured to adjust the corresponding gain value based on the corresponding pair of first and second scaled outputs;

a controller configured to adjust the corresponding control signal based on the gain value; and a mechanism that applies corrections to the corresponding gain value so to maintain the corresponding gain value within a predetermined range that is narrower than the entire range of possible values while applying complementary adjustments to the control signal.

11. The automatic gain control circuit of claim 10 wherein at least one of the gain processing circuits further comprises:

a detector configured to evaluate the corresponding pair of first and second scaled outputs, or respective portions thereof, and generate an evaluation result, wherein the evaluation result is used by the gain adjustor to determine how to adjust the corresponding gain value.

12. The automatic gain control circuit of claim 11 wherein the detector evaluates the corresponding pair of first and second scaled outputs to determine whether both of the respective absolute values of the corresponding pair of first and second scaled outputs fall below a predetermined threshold.

13. The automatic gain control circuit of claim 11 wherein:

the gain adjustor operates in one of a plurality of modes including an acquisition mode and a tracking mode;

during the acquisition mode, the gain adjustor seeks an optimal level for the corresponding gain value, the optimal level being within a predetermined range having two delimiting limits; and during the tracking mode, the gain adjustor maintains the optimal level for the corresponding gain value; and during the tracking mode, upon the corresponding gain value reaching either one of the two delimiting limits, the gain adjustor and the controller simultaneously adjust the corresponding gain value and the corresponding control signal respectively, thereby maintaining a composite gain relatively unchanged while keeping the corresponding gain value within the predetermined range.

14. The automatic gain control circuit of claim 13 wherein:

the gain adjustor continues to engage in the acquisition mode if gain swapping occurs within a predetermined time period; and the gain adjustor switches from the acquisition mode to the tracking mode if gain swapping does not occur within the predetermined time period.

15. The automatic gain control circuit of claim 10 wherein:

the entire range of possible values is generally 0.0 to 2.0; and the predetermined range is generally 0.5 to 1.5.

16. The automatic gain control circuit of claim 10 wherein the first component is an in-phase (I)-component and the second component is a quadrature (Q)-component.

17. The automatic gain control circuit of claim 10 wherein the automatic gain control circuit is implemented using hardware, software or a combination of both.

18. A demodulator incorporating the automatic gain control circuit of claim 10.

19. A circuit configured to provide automatic gain control, comprising:

a selector configured to scale down an input signal having a first component and a second component and generate a first selected output and a second selected output using a control signal and the first component and the second component respectively, wherein the first and second components are in digital form;

a scaler configured to generate a first scaled output and a second scaled output using the first and second selected outputs and a gain value;

a gain adjustor configured to adjust the gain value using the first and second scaled outputs; and a controller configured to adjust the control signal using the gain value, the controller also being configured to control the speed at which the gain adjustor adjusts the gain value;

wherein:

the gain adjustor is capable of operating in one of a plurality of modes including an acquisition mode and a tracking mode;

during the acquisition mode, the gain adjustor seeks an optimal level for the gain value, the optimal level being within a predetermined range having two delimiting limits, the predetermined range being narrower than the entire range of possible values;

during the tracking mode, the gain adjustor maintains the optimal level for the gain value; and during the tracking mode, upon the gain value reaching either one of the two delimiting limits, the gain adjustor and the controller simultaneously adjust the gain value and the control signal respectively, thereby maintaining a composite gain for the circuit relatively unchanged while keeping the gain value within the predetermined range.

20. The circuit of claim 19 further comprising:
a detector configured to evaluate the first and second scaled outputs, or respective portions thereof, and generate an evaluation result;
wherein the evaluation result is used by the gain adjustor to determine how to adjust the gain value.

21. The circuit of claim 20 wherein the detector evaluates the first and second scaled outputs to determine whether the respective absolute values of both of the first and second scaled outputs fall below a predetermined threshold.

22. The circuit of claim 19 wherein:
the first and second components each includes a plurality of bits;
the first and second selected outputs are respectively made up of subsets of bits selected from the corresponding plurality of bits associated with the first and second components; and
the subsets of bits are selected from the corresponding plurality of bits associated with the first and second components based on the control signal.

23. The circuit of claim 19 wherein:
the scaler generates the first scaled output by multiplying the first selected output with the gain value to produce a first multiplication result and then selecting portions of the first multiplication result as the first scaled output; and
the scaler generates the second scaled output by multiplying the second selected output with the gain value to produce a second multiplication result and then selecting portions of the second multiplication result as the first scaled output.

24. The circuit of claim 19 wherein the gain value is maintained within a predetermined range.

25. The circuit of claim 19 wherein the first component is an in-phase (I)-component and the second component is a quadrature (Q)-component.

26. The circuit of claim 19 wherein:
the gain adjustor continues to engage in the acquisition mode if gain swapping occurs within a predetermined time period; and
the gain adjustor switches from the acquisition mode to the tracking mode if gain swapping does not occur within the predetermined time period.

27. The circuit of claim 19 wherein the circuit is implemented using hardware, software or a combination of both.

28. A demodulator incorporating the circuit of claim 19.

29. A method for providing automatic gain control in a digital manner, comprising:
receiving an input signal having a first component and a second component, the first and second components being in digital form;
generating a first selected output and a second selected output by selecting respective bit portions from the first and second components based on a control signal;
generating a first scaled output and a second scaled output by using the first selected output and the second selected output and a gain value;
adjusting the gain value based on the first and second scaled outputs;
adjusting the control signal based on the gain value; and
engaging in gain swapping upon the gain value reaching either one of two delimiting limits, the delimiting limits being closer than the maximum possible range of gain values, wherein during gain swapping, the gain value and the control signal are adjusted simultaneously, thereby maintaining a composite gain for the automatic gain control relatively unchanged while keeping the gain value within the predetermined range.

30. The method of claim 29 wherein adjusting the gain value based on the first and second scaled outputs comprises evaluating the first and second scaled outputs to determine whether the respective absolute values of both of the first and second scaled outputs fall below a predetermined threshold.

31. The method of claim 29 wherein adjusting the gain value based on the first and second scaled outputs comprises maintaining the gain value within a predetermined range.

32. The method of claim 29 wherein adjusting the gain value based on the first and second scaled outputs comprises engaging in an acquisition mode during which an optimal level for the gain value is reached, the optimal level being within the predetermined range.

33. The method of claim 32 further switching from the acquisition mode to the tracking mode when gain swapping has not occurred within a predetermined time period during the acquisition mode.

34. The method of claim 29 wherein:
the first and second components each includes a plurality of bits;
the first and second selected outputs are subsets of bits respectively selected from the corresponding plurality of bits associated with the first and second components.

35. The method of claim 34 wherein generating the first scaled output further comprises:
multiplying the first selected output with the gain value to produce a first multiplication result; and
selecting a portion of the first multiplication result as the first scaled output;
wherein generating the second scaled output further comprises:
multiplying the second selected output with the gain value to produce a second multiplication result; and
selecting a portion of the second multiplication result as the second scaled output.

36. The method of claim 29 wherein the method is implemented using hardware, software or a combination of both.

37. A demodulator utilizing the method of claim 29.

38. A method for providing automatic gain control in a digital manner, comprising:
receiving an input signal having a first component and a second component, the first and second components being in digital form;
generating a first selected output and a second selected output by selecting respective bit portions from the first and second components based on a first control signal;
generating a first scaled output and a second scaled output by using the first selected output and the second selected output and a gain value;
adjusting the gain value based on the first and second scaled outputs;
adjusting the first control signal based on the gain value;
engaging in an acquisition mode during which an optimal level for the gain value is reached, the optimal level being within a predetermined range having two delimiting limits;
engaging in a tracking mode during which the optimal level for the gain value is maintained within the two delimiting limits;
switching between the acquisition mode and the tracking mode in response to a second control signal derived from the gain value; and during the tracking mode, engaging in gain swapping upon the gain value reaching either one of the two delimiting limits, wherein during gain swapping, the gain value and the control signal are adjusted simultaneously, thereby maintaining a composite gain for the automatic gain control relatively unchanged while keeping the gain value within the predetermined range.

39. A system for providing automatic gain control, comprising:
a selector configured to receive an input signal having a first component and a second component, the first component and the second component being in digital form, the selector further configured to select respective bit portions from the first and second components based on a control signal to generate a first selected output and a second selected output;
a scaler configured to receive the first and second selected outputs, to multiply the first and second selected outputs against a gain value, and to generate a first scaled output and a second scaled output respectively;
a gain adjustor configured to provide the gain value and to adjust the gain value based on the first and second scaled outputs; and
a controller configured to adjust the control signal based on the gain value, and further configured to generate a second control signal;
wherein:
the gain adjustor operates in one of a plurality of modes including an acquisition mode and a tracking mode, the mode being determined by the second control signal;
during the acquisition mode, the gain adjustor seeks an optimal level for the corresponding gain value, the optimal level being within a predetermined range having two delimiting limits;
during the tracking mode, the gain adjustor maintains the optimal level for the corresponding gain value; and
during the tracking mode, upon the corresponding gain value reaching either one of the two delimiting limits, the gain adjustor and the controller simultaneously adjust the corresponding gain value and the corresponding control signal respectively, thereby maintaining a composite gain for the system relatively unchanged while keeping the gain value within the predetermined range.

40. An automatic gain control circuit, comprising:
a selector circuit configured to receive a plurality of input signals, each input signal having a first component and a second component, the first and second components being in digital form, the selector circuit further configured to select respective bit portions from the first and second components of each input signal based on a corresponding control signal to generate a pair of corresponding first and second selected outputs for each input signal;
a scaler circuit configured to receive the corresponding pairs of first and second selected outputs for the plurality of input signals and multiply each corresponding pair of first and second selected outputs against a corresponding gain value and generate a corresponding pair of first and second scaled outputs; and
a plurality of gain processing circuits, each gain processing circuit associated with an input signal and configured to adjust the corresponding gain value and control signal for the associated input signal based on the corresponding pair of first and second scaled outputs wherein at least one of the gain processing further comprises:
a gain adjustor configured to adjust the corresponding gain value based on the corresponding pair of first and second scaled outputs; and
a controller configured to adjust the corresponding control signal based on the gain value, and further configured to generate a second control signal;
wherein:
the gain adjustor operates in one of a plurality of modes including an acquisition mode and a tracking mode, the mode being determined by the second control signal;
during the acquisition mode, the gain adjustor seeks an optimal level for the corresponding gain value, the optimal level being within a predetermined range having two delimiting limits;
during the tracking mode, the gain adjustor maintains the optimal level for the corresponding gain value; and
during the tracking mode, upon the corresponding gain value reaching either one of the two delimiting limits, the gain adjustor and the controller simultaneously adjust the corresponding gain value and the corresponding control signal respectively, thereby maintaining a corresponding composite gain for the system relatively unchanged while keeping the corresponding gain value within the predetermined range.

41. A circuit configured to provide automatic gain control, comprising:
a selector configured to scale down an input signal having a first component and a second component and generate a first selected output and a second selected output using a first control signal and the first component and the second component respectively, wherein the first and second components are in digital form;
a scaler configured to generate a first scaled output and a second scaled output using the first and second selected outputs and a gain value;
a gain adjustor configured to adjust the gain value using the first and second scaled outputs; and
a controller configured to adjust the control signal using the gain value, and further configured to generate a second control signal;
wherein:
the gain adjustor is capable of operating in one of a plurality of modes including an acquisition mode and a tracking mode, the mode being determined by the second control signal;
during the acquisition mode, the gain adjustor seeks an optimal level for the gain value, the optimal level being within a predetermined range having two delimiting limits;
during the tracking mode, the gain adjustor maintains the optimal level for the gain value; and
during the tracking mode, upon the gain value reaching either one of the two delimiting limits, the gain adjustor and the controller simultaneously adjust the gain value and the control signal respectively, thereby maintaining a composite gain for the circuit relatively unchanged while keeping the gain value within the predetermined range.

* * * * *